TUNER HAVING CAM-DRIVEN VERNIER AND HAVING SNAP-SPRING DETENTING MEANS FOR BYPASSING THE CAM'S RETURN PROFILE

Filed March 4, 1963 2 Sheets-Sheet 1

INVENTORS:
ALARICO A. VALDETTARO
JIMMIE E. WARTHAN
BY *Mason, Kolehmainen, Rathburn and Wyss.*
ATT'YS INVENTORS:
ALARICO A. VALDETTARO
JIMMIE E. WARTHAN
BY *Mason, Kolehmainen, Rathburn and Wyss.*
ATT'YS 3,172,062
Patented Mar. 2, 1965

3,172,062

TUNER HAVING CAM-DRIVEN VERNIER AND HAVING SNAP-SPRING DETENTING MEANS FOR BYPASSING THE CAM'S RETURN PROFILE

Alarico A. Valdettaro, Bloomington, and Jimmie E. Warthan, Stinesville, Ind., assignors to Sarkes Tarzian, Inc., Bloomington, Ind., a corporation of Indiana Filed Mar. 4, 1963, Ser. No. 263,096
25 Claims. (Cl. 334—51)

The present invention relates to television tuners, and more particularly, to television tuners of the type employing a station selector shaft having a plurality of channel selecting positions, one position being provided for each television channel to be received.

Present-day television tuners of the rotary type include an incrementally rotatable channel selector shaft for selectively connecting certain ones of a plurality of tuned circuit elements into operative circuit relationship with other tuner elements for each of a plurality of channel selecting positions. Because of the difficulty of accurately setting the values of the tuned circuit elements, and because of the desirability of accurately tuning the local oscillator for clear reception in each of the channel positions of the station selector shaft, it is customary to include in the oscillator circuit a fine tuning impedance device having an adjustable value. This impedance device, which may be either an inductance or a capacitor, is conventionally adjusted by means of a vernier or fine tuning shaft, frequently concentrically mounted with respect to the channel selector shaft. The fine tuning shaft is connected to the adjustable impedance and is adjustable by the vernier to obtain sharp or peaked tuning for each channel. Frequently, this impedance device is mounted on the tuner chassis in a position extending parallel to the axis of the channel selector shaft and is provided with a movable core or plunger engaging a cam driven by the fine tuning shaft. If the frequency of the oscillator circuit changes from that desired for producing a sharp, well-defined picture, this frequency change, of course, results in a deterioration of the picture quality. Thus, if the oscillator frequency is decreased from the optimum value the picture smears while an increase in oscillator frequency from this smear point normally causes the picture to first become sharper, then to become "wormy" or "wave-filled" and then to cause the appearance of bubbles and sound in the picture. For this reason persons experienced in operating the fine tuning control normally adjust the fine tuning by turning the control until the picture becomes "wormy" whereupon the control is then backed off until the picture becomes crisp or sharp. If the operator knows the direction in which the oscillator frequency is changing as the fine tuning shaft is rotated in a given direction the fine tuning adjustment is a fairly simple procedure but if he is unaware of the direction in which this frequency is changing he may miss the sharp picture area altogether or he may have trouble in finding it. This problem is particularly acute in the case of dealers or others demonstrating television receivers to prospective customers because such prospective customers may gain bad impressions of the receiver if they notice that the dealer or demonstrator is having difficulty in tuning it. In order to simplify the tuning procedure some prior art tuners use stops for the fine tuning control so that once the stop is engaged without encountering the desired sharp picture point the direction of rotation of the fine tuning shaft must be reversed. These devices possess the disadvantage that they are subject to frequent failure due to breaking of the stops or the components of the fine tuning control. This breakage arises from the general use of a large fine tuning knob which applies substantial torque to the fine tuning shaft which torque often becomse sufficient to break the parts. In an effort to overcome this disadvantage some of the prior art tuners have incorporated slip clutches in the drive train of the fine tuning control so that the clutches will slip in response to large forces applied after a stop is encountered but these clutches are expensive and, in addition, are unreliable because they frequently introduce undesired slippage in the operating area of the fine tuning control. Another prior art arrangement for simplifying the fine tuning procedure has been the use of a fine tuning control cam so constructed that the oscillator frequency decreases during one half a revolution of the fine tuning knob and increases during the other half revolution. However, with this arrangement the operator does not know whether the oscillator frequency is increasing or decreasing and, hence, he may be required to hunt for the sharp picture area. In addition, the latter arrangement makes the fine tuning impedance highly sensitive to small changes in the knob position and, hence, provides a very small angle within which the knob adjustment is effective to change the picture from "smear" to "sharp" to "wormy" in the manner described above. Thus, the latter arrangement is not altogether satisfactory because it still makes the fine tuning adjustment difficult and, at the same time, increases the instability of the oscillator and other tuning circuits which are likely to be affected to a substantial degree by relatively small changes in the fine tuning control as might be caused by vibration or the like. The present invention, therefore, has for a primary object the provision of a fine tuning arrangement which avoids all of the problems discussed above.

Another object of the invention is to provide a fine tuning arrangement which avoids the use of expensive components and, hence, is relatively inexpensive to manufacture.

A further object of the invention is to provide a fine tuning arrangement which is devoid of stops and/or clutches and, hence, is not subject to frequent breakage so that the tuner has a long, trouble-free operating life.

This invention has for another object the provision of a fine tuning arrangement resulting in a much simpler fine tuning procedure than the prior art devices.

It is a further object of the invention to provide a "skip-over" fine tuning arrangement including a detent mechanism acting upon a cam and effective to indicate the ends of the range of adjustment of the fine tuning impedance and also to abruptly drive both the cam and the fine tuning impedance from one end of the range to the other if the cam is moved past the detent.

It is another object of the invention to provide a "skip-over" fine tuning arrangement including a detent mechanism acting upon a cam driven by the fine tuning shaft and effective at each end of the range of adjustment of the fine tuning impedance to abruptly drive the fine tuning impedance from that end of the range to the other and to prevent the impedance adjustment from stopping during the transition thus insuring that rotation of the fine tuning shaft in a given direction is always effective to change the oscillator frequency in the same direction.

Television tuners commonly in use today may be generally classified as being of two types. The first type is usually identified as a switch type tuner in which a number of switch wafers are employed for the various RF amplifier, mixer and oscillator portions of the tuner. Each of these switch wafers comprises a rotor and a stator, the stator carrying a number of stationary contacts between which are conected incremental inductances which may be selectively connected into the various portions of the tuner by means of the rotor switch contacts. The other type of tuner is generally known as a turret type tuner and employs a rotatable switching drum which carries a number of individual panels on which are positioned the tuning coils for the various portions of the tuner such as the RF amplifier oscillator, mixer and oscillator sections. This drum is rotated bodily by means of the main tuning shaft so that indivdiual panels are selectively moved into engagement with a set of stationary contacts so that different tuning coils can be connected into the circuitry of the tuner.

In both of these types of tuners, it is important that the main tuning shaft of the tuner be mounted in precision type bearings. This is important particularly with the switch type tuner from the standpoint of resetability of the rotor switch contacts when changing from one channel to another. This is because a slightly different position of the switch rotor may provide a different tuning inductance which will affect the tuned portions of the tuner, particularly the oscillator sections thereof. In both types of tuners it is also important to support the cam acting upon the fine tuning impedance in such manner that the position of the fine tuning shaft and/or the cam is not altered when the main tuning shaft is tuned. In addition, the cam should be supported on the tuner chassis in such manner that vibration and/or bending of the chassis will not affect the setting of the cam or the variable fine tuning impedance. Finally the bearings for the main tuning shaft of the tuner and the support for the fine tuning cam should be constructed as economically as possible, since manufacture of tuners is highly competitive and is conducted on a low profit margin.

In both the switch type and the turret type tuners, it is necessary to provide some sort of indexing arrangement for the main tuning shaft of the tuner so that the main tuning shaft will be indexed by suitable detents or the like in a number of positions corresponding to the assigned television channels. Such an arrangement is to be distinguished from the so-called continuous type tuner in which the main tuning shaft of the tuner is continuously variable to cover the television channels which are to be received by the tuner.

It is, therefore, an important object of the present invention to provide a tuner wherein a new and improved support is used for the fine tuning cam which support also provides precision type bearings for the main tuning shaft of the tuner, thus resulting in a simple and economical construction.

It is a further object of the present invention to provide a tuner having a new and improved support for the fine tuning cam which support also provides loaded precision bearings at each end of the main tuning shaft.

It is a still further object of the present invention to provide a new and improved tuner having a novel support for the fine tuning cam which support also provides precision bearings for the main tuning shaft of the tuner and, at the same time, provides an indexing arrangement for the main tuning shaft in a simple and economical manner.

It is another object of the present invention to provide a tuner utilizing a new and improved support for the fine tuning cam which support also provides precision bearings for the main tuning shaft of the tuner while, at the same time, indexing of the main tuning shaft is accomplished by means of a common spring acting upon the support thus providing a very simple and inexpensive construction.

The invention has for another object the provision of a tuner having a new and improved arrangement for supporting the fine tuning cam in such manner that the cam position is not disturbed by adjustment of the main tuning shaft.

It is also an object of the invention to provide a tuner having a new and improved arrangement for supporting the fine tuning cam upon a wall of the tuner chassis in such manner that the cam setting and the fine tuning impedance are not disturbed by vibration and deflection or bending of the chassis wall.

A further object of the invention is to provide a tuner combining the desirable features of the "skip-over" fine tuning arrangement described above and the new and improved cam support, indexing spring and bearing providing means.

The invention, both as to its organization and manner of operation, together with further objects and advantages thereof, will best be understood by reference to the following detailed description taken in connection with the accompanying drawings wherein.

Figure 1:
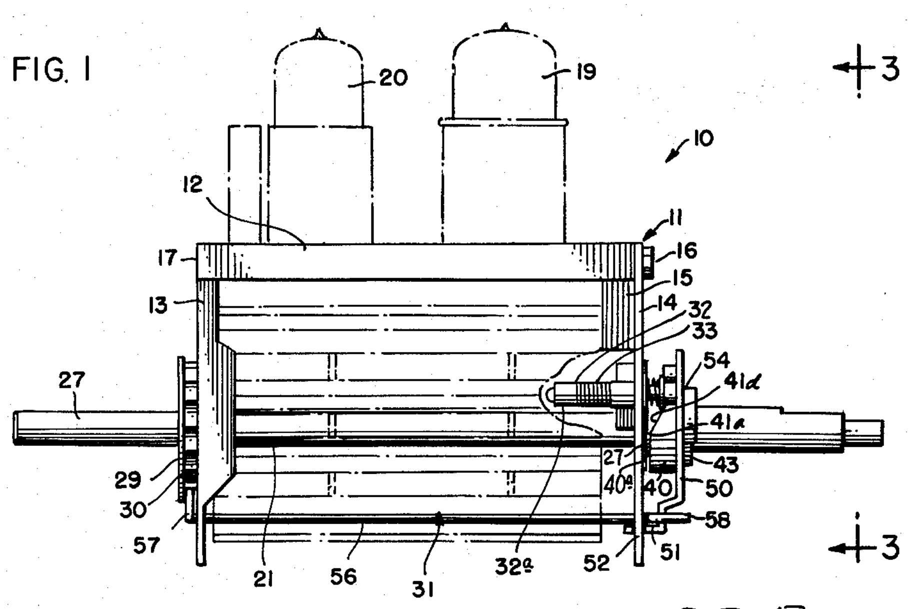
FIG. 1 is a side elevational view of an improved tuner characterized by the features of the present invention with a portion of the cover or shield broken away to show the fine tuning impedance and other components mounted within the tuner compartment of the chassis.
Figures 2, 3, 9:
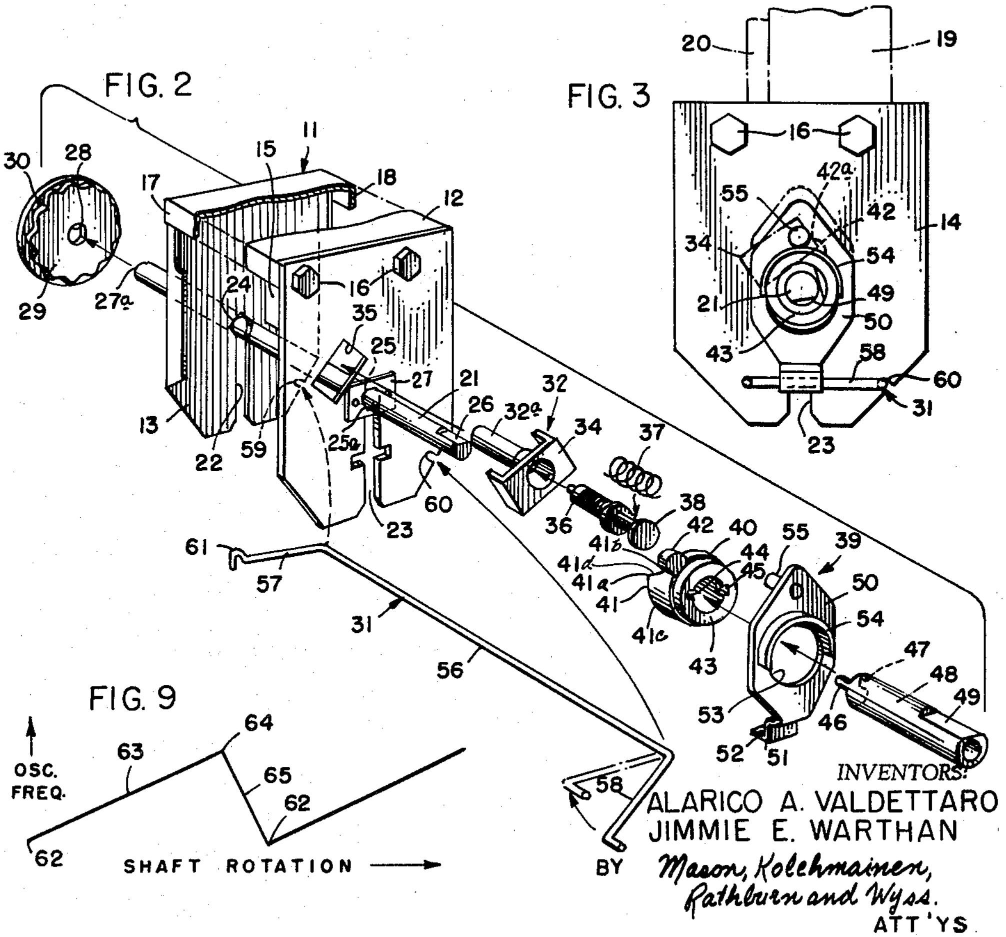
FIG. 2 is an exploded, perspective view showing the major components of the tuner of the present invention with the tuner chassis being broken and the elements mounted thereon being eliminated in order to clarify the illustration.
FIG. 3 is a fragmentary, end view looking in the direction of the arrow pointed lines 3—3 in FIG. 1 and shows the fine tuning control of the present invention in a first of its limiting end positions.
FIG. 9 is a graph plotting oscillator frequency against fine tuning shaft rotation and is useful in explaining the operation of the present invention.

Referring now to the drawings and first to FIG. 1 a tuner generally identified by the reference numeral 10 is there shown comprising a chassis 11 including an integral L-shaped member forming an upper deck 12 and a rear wall 13. The chassis 11 further includes a front wall 14 which is secured by means of a pair of machine screws 16 to a pair of depending angle braces 15 formed on the forward end of the upper deck 12. In order to increase the rigidity of the tuner chassis and particularly of the deck 12 a pair of side flanges 17 and 18 best shown in FIG. 2 are provided on the deck 12 and depend a short distance downwardly along the end walls 13 and 14. The deck 12 may further include suitable means for supporting a cover or shield (not shown) which cooperates with the deck and with the end walls 13 and 14 to form a closed tuner compartment. The deck 12 supports the electrical components of the tuner including tube sockets for a pair of tubes 19 and 20. Preferably, the tube 19 is a pentode and acts as the radio frequency amplifier of the tuner while the tube 20 is preferably a dual triode functioning as both the mixer and local oscillator.

In order to mount an elongated main tuning or channel selector shaft 21 the front and rear walls of the chassis are provided with a pair of elongated upwardly extending slots 22 and 23. The slot 22 terminates in a pair of inverted V-shaped bearing surfaces 24 and the shaft 21 is provided with a suitable groove so that the rear end of the shaft 21 may be inserted in the slot 22 and ride on the V bearing surfaces 24. The slot 23 provides a clearance opening and a separate plate 27, which may be secured to the front wall 14 of the turner by any suitable means, is provided with an opening defining a pair of V shaped bearing surfaces 25a on which the front end of the shaft 21 rides to provide a smooth bearing surface having minimum friction and drag. The shaft 21 is provided with a flat 26 at its front end to receive a conventional channel selector knob not shown in the drawings. The latter knob may be turned to rotate the main tuning shaft in steps or increments to different angular positions to permit selection of the particular television channel to which the tuner 10 is to be tuned. The rearwardly disposed end portion 27a of the main tuning shaft is of double D cross section and is inserted through an aperture 28 which has a configuration corresponding to the cross section of the end portion 27a and is formed centrally in a detent plate 29. The plate 29 has a toothed peripheral portion 30 cooperating with a torsion bar spring 31 to index and accurately position the main tuning shaft 21 in each of its channel selecting positions.

The tuner as illustrated in FIG. 1 is of the turret or stick type although it should be understood that the features of the present invention are also applicable to tuners of the switch type. In each case, an arrangement such as shown and described in Valdettaro and Badger application Serial No. 63,889, filed October 20, 1960 and assigned to the same assignee as the present invention may be employed wherein a splined station selector shaft may be employed for rotating the respective switch rotors while permitting removal of the shaft and suitable grooves are provided in the shaft which seat on the V-shaped bearing surfaces provided in the end walls of the tuner. As is well known in the art, the main tuning shaft of a turret type tuner carries a plurality of axially displaced supports or spacer discs having peripheral notches therein for supporting a plurality of sticks or multiple inductance units, one such stick or multiple inductance unit being provided for each television channel to be selected by the main tuning shaft. Since the disc and inductor unit construction is well known in the art it is neither illustrated in the drawings nor described in detail.

Referring now to the fine tuning mechanism of the tuner 12 the fine tuning impedance may comprise any suitable variable reactance, for example, a variable inductor or a variable capacitor but it is illustrated in the drawings as a variable inductance 32 which is connected into the oscillator portion of the tuner so as to provide a small variation in oscillator frequency in each of the channel selecting positions of the main tuning shaft 21, as will be readily understood by those skilled in the art. The variable inductance may take any conventional well known form but, as shown, it comprises a cylindrical coil form 32 supporting a winding 33 wrapped around the exterior of the coil form. The coil form is supported on a suitable base 34 which is, in turn, mounted within an aperture 35 formed in the front wall 14 of the tuner chassis. A movable core or tuning element 36, formed of ferromagnetic material such as powdered iron, is slidably movable within the coil form to vary the inductance of the impedance 33 in the usual manner. The movable core is biased forwardly by a coil spring 37 normally urging the core in a direction tending to move it out of the coil spring form 32*a*. The coil acts between the base member 34 and an enlarged outer head member 38 on the core.

To vary the inductance the movable core is moved into or out of the coil form by a fine tuning control indicated generally by the reference numeral 39 and including end faced cam 40 acting on the enlarged head member 38. The cam 40 is mounted concentrically on the main tuning shaft 21 and, to this end, has a central, axial, circular bore extending therethrough. The cam includes an inner hub 40*a* seated against the front wall 14. The end face 41 of the cam 40 includes a first gradually inclined or tapering portion 41*c* extending from a maximum thickness point or apex 41*a* to a minimum thickness point or trough 41*b*. The points 41*a* and 41*b* are joined by a steep or sharply inclined face 41*d*. The cam 40 further includes a peripheral region or circular body portion having a radially outwardly extending curved ear or detent 42 thereon. An integrally formed smaller diameter hub portion 43 extends forwardly from the circular region and is provided with diametrically opposed recesses 44 and 45 for receiving tines 46 and 47, respectively, formed on the inner end of a hollow fine tuning or vernier shaft 48 mounted concentrically upon the forward end of the main tuning shaft 21. More specifically, the fine tuning shaft is provided with a circular axial bore therethrough for receiving the front end portion of the main tuning shaft 21 and, in addition, the fine tuning shaft includes a non-circular outer end portion 49 for accommodating a fine tuning knob which is not shown in the drawings. When the latter knob is turned the fine tuning shaft and its tines 46 and 47 obviously rotate the cam 40 whereupon the end face 41 causes the movable core 36 to move axially within the coil form 32*a*, the direction of axial movement being a function of the direction of turning of the cam.

Figure 4:
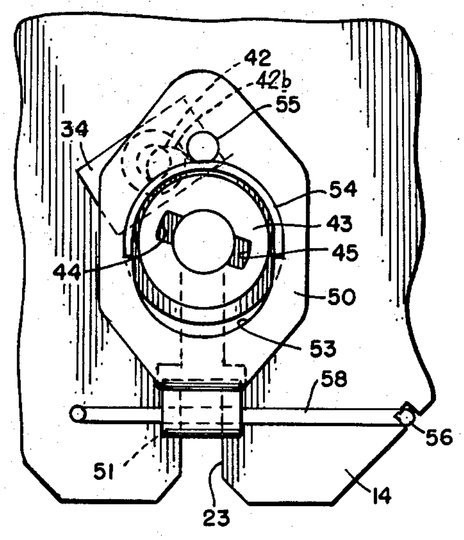
FIG. 4 is an enlarged, fragmentary end view showing the fine tuning control characterized by the features of the present invention in the second of its limiting positions but with the fine tuning or venier shaft removed.
Figure 5:
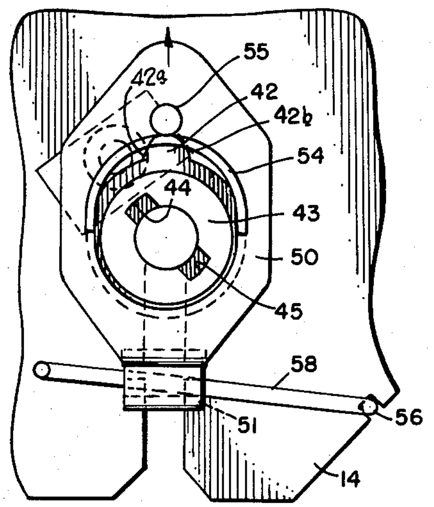
FIG. 5 is a view similar to FIG. 4 but shows the position of the parts during the "skip-over" operation of the detent mechanism associated with the fine tuning control.

The cam 40 is supported by a retainer plate or support 50 which is, in turn, slidably mounted upon the front wall 14 of the tuner chassis. To effect the latter mounting, the plate 50 includes an inturned lower leg or flange 51 having aligned notches or slots 52 in its opposed side edges which slots form a guide or track to permit insertion of the leg into the elongated slot 23. The leg 51 and its notches 52 permit movement of the plate or support 50 axially of the slot 23 but limit sidewise movement of the plate relative to the slot. The plate 50 has an elongated or oval shaped opening 53 formed therein and a raised collar or hub 54 extending approximately half way around the latter opening. The opening 53 and the hub 54 receive the hub 43 on the cam and form a bearing surface for the peripheral region of the cam. A stud 55 extends inwardly from the plate 50 toward the wall 14 adjacent to the peripheral region of the main body portion of the cam. The hub 54 is biased into peripheral engagement with the hub portion 43 of the cam by means of the torsion spring 31 described above. More specifically, the torsion bar spring 31 includes a center or bight portion 56 and a pair of end portions or arms 57 and 58. The torsion bar spring 31 is positioned in the chassis 11 by locating means formed in the front and rear walls 13 and 14 which locating means comprises an opening or recess 59 in the rear wall and a notch or opening 60 in the front wall. The opening 59 is aligned with the notch 60 in a direction extending axially of the main tuning shaft 21. To assemble the torsion bar spring 31 on the tuner chassis the spring is first positioned in the openings 59 and 60 and the hooked end 61 of the rear end portion 57 is seated within one of the interdental notches in the toothed portion 30 of the detent wheel 29. The forward arm 58 of the torsion bar spring is adapted to engage the leg 51 of the retainer plate or support 50. Initially the arms 57 and 58 are inclined relative to one another as is shown in FIG. 2 where these two arms occupy the positions shown in solid lines. When the torsion bar spring is assembled on the chassis 11 with the hooked end 61 in engagement with the detent wheel 29 the forward arm 58 is bent to the position shown in dotted lines in FIG. 2 thus providing a bias on the arm 57 to hold the index wheel in position and, at the same time, biasing the retainer plate or support 50 downwardly as viewed in FIG. 2. The bias placed on the retaining plate 50 by the torsion bar spring urges the grooved forward end of the main tuning shaft 21 against the V-shaped bearing surfaces 25*a* in the plate 27. At the same time the rearwardly disposed portion of the main tuning shaft 21 is biased into engagement with the V-shaped bearing surfaces 24 in the rear wall 13. It will thus be evident that the torsion bar spring 31 performs a number of different functions in that it (*a*) maintains both ends of the main tuning shaft 21 against their respective V-shaped bearing surfaces, (*b*) it provides a detent action for the main tuning shaft 21 by virtue of engagement of the hooked end 61 with the notches on the index wheel 29 and (*c*) it biases the hub 54 of the retaining plate 50 against the cam 40 to cooperate with the cam to provide a detent means in the manner described below. More specifically, the latter detent means includes the stud 55 and the radial ear or detent 42 formed on the cam. The ear 42 is so disposed with respect to the sharply inclined cam portion 41*d* that it engages one side of the stud 55 when the cam is in the limiting position shown in FIG. 3 and engages the other side of the stud when the cam reaches the limiting position shown in FIG. 4. With the fine tuning control 39 in the limiting position shown in FIG. 3, the core 36 is in engagement with the point 41*a* and, hence, is fully inserted into the coil form so that the inductance of the device is at a maximum value and the oscillator frequency is a minimum. When the fine tuning control 39 is in the limiting position shown in FIG. 4, the core 36 is in engagement with the point 41*b* and the oscillator frequency is of maximum value. The stud is spring biased against the ear and, hence, resists turning the cam beyond either limiting position, thus providing a positive indication to the operator that the fine tuning shaft has reached limiting position. If the fine tuning shaft is turned beyond either limiting position by the application of a relatively large force to the fine tuning knob, the stud 55 is raised along one curved side of the ear 42 whereupon the retainer plate or support 50 is deflected or moved upon the front wall 14 to the position shown in FIG. 5. If the force is released before the stud reaches the apex or center of the ear the torsion bar spring pulls the plate 50 downwardly and turns the cam slightly until it reverts to the original limiting position. On the other hand if the stud reaches the apex of the ear, the spring immediately forces the plate downwardly to drive the stud 55 along the other curved side of the ear and, hence, to rotate the cam to the other limiting position. The detent means including the ear 42 and the stud or follower 55 thus effectively prevents the cam from coming to rest as the ear passes the stud.

The described mounting structure for the cam and the fine tuning shaft 48 effectively prevents rotation of the fine tuning shaft when the channel selector shaft 21 is turned in changing from one channel selecting position to another. Thus, in many prior art constructions using an end faced cam in engagement with a spring biased movable tuning element of a variable impedance, the biasing spring is effective to move the cam axially away from the tuner chassis so that either the cam or the fine tuning shaft or both are effectively urged into the engagement with the main tuning shaft through the customary retaining ring for the fine tuning shaft and, as a result, rotation of the main tuning shaft is effective to alter the position of the cam and the movable tuning element of the variable impedance. In accordance with the present invention, the cam is supported from the front wall 14 of the tuner chassis in such manner that this problem is avoided. This desirable result is achieved by the plate 50 and the torsion bar spring 31 which act to prevent movement of the plate and the cam away from the front wall in a direction extending axially of the shaft 21. Moreover, in the mounting arrangement of the present invention the biasing or loading produced by the torsion bar spring 31 on the offset flange 51 of the plate 50 effectively forces the inner hub 40*a* of the cam against the front wall of the tuner rather than biasing the cam and fine tuning shaft forwardly against a retaining ring mounted on the main tuning shaft as in prior art arrangements. It will also be noted that the wall on which the variable tuner or fine tuning impedance is located is the same wall against which the inner hub 40*a* is biased by the spring 31. Thus, the cam and the fine tuning impedance are both positioned with reference to the same surface so that the position of the cam 40 and the axial position of the movable core 36 are not affected by vibration of the tuner chassis or bending of the front wall 14.

Figure 6:
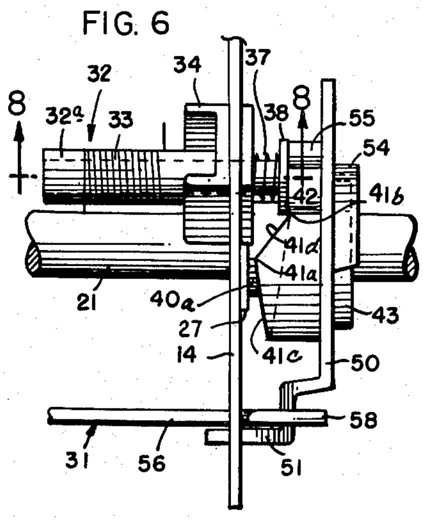
FIG. 6 is an enlarged, fragmentary side elevational view showing the fine tuning control in the second limiting end position with the fine tuning shaft again being removed.
Figure 7:
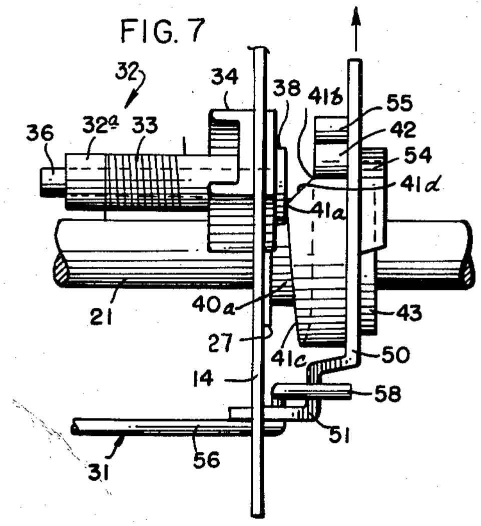
FIG. 7 is a view similar to FIG. 6 but shows the fine tuning cam and the movable core of the variable inductor in the first limiting end position.
Figure 8:
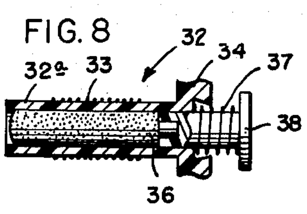
FIG. 8 is a fragmentary, sectional view taken along a line substantially corresponding to the line 8—8 in FIG. 6 and shows particularly the variable inductor and the movable core.

As was indicated above, the preferred fine tuning procedure is achieved when the tuning control is turned in a direction to increase the oscillator frequency. Since the fine tuning knob is generally turned in a clockwise direction from the front of the television receiver to effect fine tuning it is desirable that this particular direction of rotation always results in an increasing oscillator frequency. To understand the manner in which the fine tuning control of the present invention accomplishes these desired results let it first be assumed that the fine tuning control is in the position shown in FIG. 3 where the curved side 42*a* of the detent 42 is adjacent one side of the stud 55 and where the movable core 36 is fully inserted into the coil form 32*a* so that the inductance is at a maximum and the oscillator frequency is at the minimum or lower end of the adjusting range effected by the fine tuning impedance. To effect the fine tuning adjustment, the fine tuning shaft 48 and the cam 40 are turned in a clockwise direction as viewed in FIGS. 2 and 3 so that the head member 38 on the movable core rides along the gradually tapering cam face 41*c* to gradually increase the oscillator frequency. Referring to the graph shown in FIG. 9 it will be observed that the point identified by the reference numeral 62 represents the minimum oscillator frequency when the fine tuning control 39 is in the position shown in FIG. 3 and the gradually sloping portion 63 of this curve represents the gradually increasing oscillator frequency effected by turning the fine tuning shaft 48 in a clockwise direction in the manner described above. At some point during the adjustment of the fine tuning control 39 the picture should pass through the "smear" area, through the "sharp" region and then reach the "wormy" area. As was previously indicated, the general practice in adjusting the fine tuning control is to first find the point where the picture becomes "wormy" and then to reverse the direction of rotation of the fine tuning shaft to obtain a sharp, well defined picture. When this point is reached the fine tuning control 39 should, of course, be left in the position where the crisp picture is obtained. Under normal usage, if the operator does not find the "sharp" region by the time he hits the limiting position established by the ear 42 he will turn the knob back and start over again, bringing the frequency up slowly until the desired "sharp" area is encountered by backing off from the "wrong" area. However, assuming that, for some reason, the fine tuning control has been turned in such manner that it reaches the limit position shown in FIGS. 4 and 6 without finding the sharp picture area and the resistance offered by the detent means provides an indication that a limiting position has been reached, the fine tuning operation may be continued by turning the fine tuning shaft 48 further in a clockwise direction. There is no danger of breaking any of the components of the fine tuning control since this continued turning of the fine tuning shaft merely causes the curved side 42b of the detent 42 to ride under the stud 55, thus moving the retaining plate or support 50 from the position shown in FIG. 4 to that shown in FIG. 5 where the stud 55 engages the apex of the detent. The sliding movement of the retaining plate or support 50 along the front wall is guided by the track formed by the notches 52 in cooperation with the wall 14. When the retaining plate or support 50 is raised, the forward arm 58 of the torsion bar spring 31 is deflected in a clockwise direction as viewed in FIGS. 4 and 5 about the bight portion 56. The biasing action produced by the arm 56 immediately drives the stud 55 along the reverse curved side 42a of the detent 42 so that the cam 40 is rapidly restored to the minimum frequency oscillator position shown in FIG. 3. The head member 38 of the core rides along the steep portion 41d of the cam as the detent passes the stud 55. However, the curvature of the sides 42a and 42b of the detent 42 and the force of the spring 31 are such that it is very difficult to stop the fine tuning control 39 and its cam 40 during the "skip-over" which occurs as the stud 55 rides over the detent 42. Thus, the core 36 cannot be seated at any point along the steep portion 41d. This is an important feature because it prevents operation of the cam in an area in which the direction of rotation versus frequency change would be reversed from that normally provided by the cam surface 41c. In addition to the reversal of the direction of tuning, operation on the cam surface 41d would be extremely critical and unstable mechanically. The "skip-over" period is represented in FIG. 9 by the sharply inclined curved portion 65 located between the maximum oscillator frequency limiting position 64 and the minimum oscillator frequency limiting position 62.

In view of the above description it will be observed that the detent mechanism of the present invention assures that the oscillator frequency will always increase when the fine tuning shaft 48 is turned in a clockwise direction as viewed in FIGS. 2 and 3, even though the fine tuning knob is turned beyond the limiting position established by engagement of the edge 42b of the detent with the stud 55. Of course, if the shaft 48 is turned in a counterclockwise direction the oscillator frequency will decrease gradually and the abrupt change from one limiting position to the other during the "skip-over" period will result in a sharply increasing oscillator frequency. By insuring that the oscillator frequency always changes in the same direction in response to a given rotation of the fine tuning shaft it is unlikely that the sharp picture area of the fine tuning adjustment will be overlooked and, hence, the fine tuning procedure is considerably simplified by the mechanism of the present invention. This mechanism also provides a suitable detent action for the limiting position of the fine tuning shaft while avoiding the use of positive stops and/or slip clutches and, hence, overcomes the disadvantages described above with respect to frequent breakage and excessive cost. Moreover, the cam is effective to gradually change the oscillator frequency for almost the entire revolution of the fine tuning shaft and, for this reason, positive control of the movement of the movable core 36 is attained without causing sharp changes in oscillator frequency in response to a relatively small movement of the fine tuning shaft. Thus, the oscillator frequency can be effectively controlled without the use of extremely sensitive tuning impedances or fine tuning adjustments which would introduce instability into the oscillator circuit.

It is also pointed out that if desired the bias exerted by the spring 31 to provide the above described detent action may be made relatively weak or, in the alternative, the ear 42 may be made relatively small, so that only a slight detent action is provided which will indicate to the user that the steep section 41d of the cam is positioned in this area and would further indicate to the user that he should continue rotating the knob beyond the detent so as to start in on the gradually inclined surface 41c of the cam 40 again. Such an arrangement will provide the advantage of maintaining the same direction of tuning for rotation of the knob in a given direction while resetting the fine tuning element to its initial position each time the detent is traversed and indicating by the slight detent action encountered just where this resetting function is accomplished.

In view of the foregoing description it will be observed that the construction illustrated and described is effective to accomplish all of the enumerated objects of the invention. The "skip-over" fine tuning arrangement is relatively simple in construction but still provides a rugged, trouble-free and easily manipulated fine tuning control. The detent means for the fine tuning control prevents the movable tuning core from coming to rest on the steep portion of the cam and, hence, permits a cam construction to effect a fine tuning adjustment which always changes the oscillator frequency in the same direction in response to a given direction of rotation of the fine tuning shaft. At the same time, the tuner construction is simplified by the use of a single torsion bar spring for indexing the channel selector shaft, for biasing the detent elements for the fine tuning control into engagement and for biasing the main tuning shaft into engagement with its bearing surfaces. Thus, the tuner of the present invention is very economical to manufacture.

While the fine tuning element 32 is illustrated in FIGS. 1 to 8, inclusive, as being positioned parallel to the axis of the main tuning shaft 21, it will be understood that this element, whether inductive or capacitive, may be positioned in any suitable manner to be actuated by a cam surface on the rotatable member 40. Furthermore, it will be understood that the detent arrangement comprising the ear 42 on the member 40 and the stud 55 on the plate 50 is shown only for purposes of illustration and any suitable detent arrangement may be employed. For example, a suitable projection may be provided on the front face of the hub portion 43 corresponding to the area of the steep incline 41d of the cam surface and arranged to cooperate with a rearwardly extending projection on the plate 50 which would provide the "snap-over" action described above by means of a forwardly pivoting action of the plate 50 rather than by lifting the plate 50 upwardly as shown on FIGS. 4 and 5 during the "snap-over" operation. In such instance, the fine tuning element may either be positioned as shown in FIGS. 1 to 8, inclusive, or may be positioned perpendicular to the shaft 21 and actuated by engagement with an elliptical cam surface formed by the side of the member 40. In the alternative, the fine tuning element may be positioned within the tuner chassis and actuated by means of a pivoted linkage which engages a cam surface formed either on the end or side of the cam member 40.

While a particular embodiment of the invention has been illustrated and described it will be apparent that many changes and modifications will readily occur to those skilled in this art and it is therefore contemplated by the appended claims to cover all such changes and modifications as fall within the true spirit and scope of the invention.

What is claimed as new and desired to be secured by Letters Patent of the United States is:

1. A tuner comprising a chassis having a wall thereon, a main channel selecting shaft mounted for rotation on said chassis to a plurality of different angularly displaced channel selecting positions, a cam mounted concentrically with said main shaft and having a first hub portion adjacent said wall, said cam having an end face facing said wall and including a first portion tapering gradually away from said wall in a direction extending axially of said main shaft from a first end point located near the wall to a second point spaced more remotely from said wall, said end face further including a sharply inclined portion tapering abruptly from said first point to said second point, said cam having a circular peripheral region extending axially of said main shaft from said end face away from said wall, an ear extending radially outward from said peripheral region, said cam further including a second hub portion having a diameter less than that of said peripheral region and extending away from said region axially of said main shaft, a fine tuning shaft mounted concentrically upon said main shaft and including means thereon engageable with said second hub portion for drivingly connecting said fine tuning shaft and said cam, a fine tuning impedance mounted on said wall and having a movable tuning element mounted for sliding movement along an axis extending parallel to the axis of said main shaft, said impedance including means biasing said movable element against said end face of said cam so that said element is moved axially by said cam between first and second limiting end positions when the fine tuning shaft is rotated, a retaining plate having an elongated opening therein receiving the second hub portion of the cam, a stud carried by said plate and extending from said plate towards said wall, means defining a slot in said wall extending radially of the axis of said main shaft, a bent flange on said plate having a pair of notches therein cooperating to form a track for accommodating the portions of said second wall adjacent said slot, thereby to mount said plate for sliding movement upon said wall, biasing means acting on said plate to bias the stud into engagement with the peripheral region of said cam, said ear being so located with respect to said stud that it cooperates with said stud to resist turning of the fine tuning shaft beyond each limiting end point where the movable tuning element is in a limiting end position, said ear being effective in the event that said fine tuning shaft is turned beyond each of the limiting end points to slide said retaining plate with respect to said wall against the biasing means, thereby to permit the ear to pass the stud, said ear being shaped to prevent said stud from coming to rest on the ear, and said ear and said variable impedance being so located that the movable tuning element moves along said sharply inclined portion of said cam end face as said ear passes said stud, thereby to move the tuning element from one limiting end position to the other and to bring the movable tuning element into engagement with the gradually tapering portion of the cam end face.

2. A tuner comprising a chassis having a wall thereon, a main channel selecting shaft mounted for rotation on said chassis to a plurality of different angularly displaced channel selecting positions, a cam mounted concentrically with said main shaft, said cam having an end face facing said wall and including a first portion tapering gradually away from said wall in a direction extending axially of said main shaft from a first end point located near the wall to a second point spaced more remotely from said wall, said end face further including a sharply inclined portion tapering abruptly from said first point to said second point, said cam having a circular peripheral region extending axially of said main shaft from said end face away from said wall, an ear extending radially outward from said peripheral region, said cam further including a hub portion having a diameter less than that of said peripheral region and extending away from said region axially of said main shaft, a fine tuning shaft mounted concentrically upon said main shaft and including means thereon engageable with said hub portion for drivingly connecting said fine tuning shaft and said cam, a fine tuning impedance mounted on said wall and having a movable tuning element mounted for sliding movement along an axis extending parallel to the axis of said main shaft, said impedance including means biasing said movable element against said end face of said cam so that said element is moved axially by said cam between first and second limiting end positions when the fine tuning shaft is rotated, a retaining plate having an elongated opening therein receiving the hub portion of the cam, a stud carried by said plate and extending from said plate towards said wall, means mounting said plate for sliding movement upon said wall, biasing means acting on said plate to bias the stud into engagement with the peripheral region of said cam, said ear being so located with respect to said stud that it cooperates with said stud to resist turning of the fine tuning shaft beyond each limiting end point where the movable tuning element is in a limiting end position, said ear being effective in the event that said fine tuning shaft is turned beyond each of the limiting end points to slide said retaining plate with respect to said wall against the biasing means, thereby to permit the ear to pass the stud, said ear being shaped to prevent said stud from coming to rest on the ear, and said ear and said variable impedance being so located that the movable tuning element moves along said sharply inclined portion of said cam end face as said ear passes said stud, thereby to move the tuning element from one limiting end position to the other and to bring the movable tuning element into engagement with the gradually tapering portion of the cam end face.

3. A tuner comprising a chassis having a wall thereon, a main channel selecting shaft mounted for rotation on said chassis to a plurality of different angularly displaced channel selecting positions, a cam mounted concentrically with said main shaft, said cam having an end face facing said wall and including a first portion tapering gradually away from said wall in a direction extending axially of said main shaft from a first end point located near the wall to a second point spaced more remotely from said wall, said end face further including a sharply inclined portion tapering abruptly from said first point to said second point, said cam having a peripheral region extending axially of said main shaft from said end face away from said wall, a detent extending radially outward from said peripheral region, a fine tuning shaft mounted concentrically upon said main shaft and including means thereon drivingly engageable with said cam, a fine tuning impedance mounted on said wall and having a movable tuning element mounted for sliding movement along an axis extending parallel to the axis of said main shaft, said impedance including means biasing said movable element against said end face of said cam so that said element is moved axially by said cam between first and second limiting end positions when the fine tuning shaft is rotated, a retaining plate supporting said cam and having a cam follower thereon engaging the peripheral region of the cam, means mounting said plate for sliding movement upon said wall, biasing means acting on said plate to bias the cam follower into engagement with the peripheral region of said cam, said detent being so located with respect to said follower that it cooperates with said follower to resist turning of the fine tuning shaft beyond each limiting end point where the movable tuning element is in a limiting end position, said detent being effective in the event that said fine tuning shaft is turned beyond each of the limiting end points to slide said retaining plate with respect to said wall against the biasing means, thereby to permit the detent to pass the follower, said detent being shaped to prevent said follower from coming to rest on the detent, and said detent and said variable impedance being so located that the movable tuning element moves along said sharply inclined portion of said cam end face as said detent passes said follower, thereby to move the tuning element from one limiting end position to the other and to bring the movable tuning element into engagement with the gradually tapering portion of the cam end face.

4. A tuner comprising a chassis having a wall thereon, a main channel selecting shaft mounted for rotation on said chassis to a plurality of different angularly displaced channel selecting positions, a cam having an end face facing said wall and including a first portion tapering gradually away from said wall in a direction extending axially of said main shaft from a first end point located near the wall to a second point spaced more remotely from said wall, said end face further including a sharply inclined portion tapering abruptly from said first point to said second point, said cam having a peripheral region extending axially of said main shaft from said end face away from said wall, a detent extending radially outward from said peripheral region, normally operated means for rotating said cam, a fine tuning impedance mounted on said wall and having a movable tuning element mounted for sliding movement along an axis extending parallel to the axis of said main shaft, said impedance including means biasing said movable element against said end face of said cam so that said element is moved axially by said cam between first and second limiting end positions when the cam is rotated, a retaining plate supporting the cam against movement away from the plate, a cam follower carried by the plate, means mounting said plate for sliding movement upon said wall, biasing means acting on said plate to bias the follower into engagement with the peripheral region of said cam, said detent being so located with respect to said follower that it cooperates with said stud to resist turning of the fine tuning shaft beyond each limiting end point where the movable tuning element is in a limiting end position, said detent being effective in the event that said fine tuning shaft is turned beyond each of the limiting end points to slide said retaining plate with respect to said wall against the biasing means, thereby to permit the detent to pass the follower, and said detent and said variable impedance being so located that the movable tuning element moves along said sharply inclined portion of said cam end face as said detent passes said follower, thereby to move the tuning element from one limiting end position to the other and to bring the movable tuning element into engagement with the gradually tapering portion of the cam end face.

5. A tuner comprising a chassis having a wall thereon, a main channel selecting shaft mounted for rotation on said chassis to a plurality of different angularly displaced channel selecting positions, a cam having a cam face and mounted concentrically with said main shaft, a fine tuning shaft mounted concentrically upon said main shaft and including means thereon drivingly engaged with said cam, a fine tuning impedance mounted on said wall and having a movable tuning element mounted for sliding movement along an axis extending parallel to the axis of said main shaft, said impedance including means biasing said movable element against said face of said cam, said cam face including a first portion for moving said element gradually between first and second limiting end positions when the fine tuning shaft is rotated, a retaining plate supporting said cam and having a follower thereon engaging said cam, means mounting said plate for sliding movement upon said wall, biasing means acting on said plate to bias the follower into engagement with the cam, a detent on said cam so located with respect to said follower that it cooperates with said follower to resist turning of the fine tuning shaft beyond each limiting end point where the movable tuning element is in a limiting end position, said detent being effective in the event that said fine tuning shaft is turned beyond each of the limiting end points to slide said retaining plate with respect to said wall against the biasing means, thereby to permit the detent to pass the follower, said detent being shaped to prevent said follower from coming to rest on the detent, said cam face including a second portion for engaging said element to move it rapidly from one limiting end position to the other, and said detent and said variable impedance being so located that the movable tuning element moves along said second portion of said cam face as said detent passes said follower, thereby to move the tuning element from one limiting end position to the other and to bring the movable tuning element into engagement with the first portion of the cam face.

6. A tuner comprising a chassis having a wall thereon, a main channel selecting shaft mounted for rotation on said chassis to a plurality of different angularly displaced channel selecting positions, a cam having a cam face thereon, means for rotating said cam, a fine tuning impedance mounted on said wall and having a movable tuning element mounted for sliding movement along an axis extending parallel to the axis of said main shaft, said impedance including means biasing said movable element against said face of said cam, said cam face including a first portion for moving said element gradually between first and second limiting end positions when the cam is rotated, a retaining plate supporting said cam and having a follower thereon engaging said cam, means mounting said plate for sliding movement upon said wall, biasing means acting on said plate to bias the follower into engagement with the cam, a detent on said cam so located with respect to said follower that it cooperates with said follower to resist turning of the cam beyond each limiting end point where the movable tuning element is in a limiting end position, said detent being effective in the event that said cam is turned beyond each of the limiting end points to slide said retaining plate along said wall against the biasing means, thereby to permit the detent to pass the follower, said detent being shaped to prevent said follower from coming to rest on the detent, said cam face including a second portion for engaging said element to move it rapidly from one limiting end position to the other, and said detent and said variable impedance being so located that the movable tuning element moves along said second portion of said cam face as said detent passes said follower, thereby to move the tuning element from one limiting end position to the other and to bring the movable tuning element into engagement with the first portion of the cam face.

7. A tuner comprising a chassis having a wall thereon, a main channel selecting shaft mounted for rotation on said chassis to a plurality of different angularly displaced channel selecting positions, a cam having a cam face and mounted concentrically with said main shaft, a fine tuning shaft mounted concentrically upon said main shaft and including means thereon drivingly engaged with said cam, a fine tuning impedance mounted on said wall and having a movable tuning element mounted for sliding movement along an axis extending parallel to the axis of said main shaft, said impedance including means biasing said movable element against said face of said cam, said cam face including a first portion for moving said element gradually between first and second limiting end positions when the fine tuning shaft is rotated, said cam face including a second portion for engaging said element to move it rapidly from one limiting end position to the other, and detent means for preventing said cam from stopping in a position where the movable tuning element engages said second portion of said cam.

8. A tuner comprising a chassis having a wall thereon, a main channel selecting shaft mounted for rotation on said chassis to a plurality of different angularly displaced channel selecting positions, a cam having a cam face thereon, means for rotating with said cam, a fine tuning impedance mounted on said wall and having a movable tuning element coacting with the cam, said cam face including a first portion for moving said element gradually between first and second limiting positions when the cam is rotated, said cam face including a second portion coacting with said element to move the element rapidly from one limiting position to the other, and detent means for preventing said cam from stopping in a position where said second portion is effective to hold the movable element in a position intermediate the limiting positions.

9. A fine tuning control for use on a tuner and comprising a variable impedance having a variable tuning element, manually operated means including a rotatable cam effective to move said element between limiting end positions, said means including structure for rotating said cam from a first point where said element is located in one of said limiting end positions to a second point where said element is located in the other limiting end position, said cam including means effective upon operation of said structure for moving said element gradually from one limiting end position to the other as said cam is rotated from the first point to the second point, and a detent mechanism cooperating with said manually operated means to move said element abruptly from said other limiting position to said one limiting position in the event that said cam is rotated beyond said second point and for preventing said movable element from stopping in an intermediate position between said limiting positions during said abrupt movement.

10. A fine tuning control for use on a tuner and comprising a variable impedance having a variable tuning element, manually operated means movable from a first point to a second point for moving said element gradually between first and second limiting positions, and a detent mechanism cooperating with said manually operated means to move said element abruptly from said second limiting position to said first limiting position in the event that said manually operated means is moved beyond said second point and for preventing said movable element from stopping in a position intermediate said limiting positions during the abrupt movement.

11. A fine tuning control for use on a tuner and comprising a variable impedance having a variable tuning element, manually operated means acting upon said element to move it between limiting positions, said means including structure movable from a first point to a second point to move said element gradually from one limiting position to the other, and a detent mechanism cooperating with said manually operated means to move said element abruptly from said other limiting position to said one limiting position in the event that said structure is moved beyond said second point and for preventing said element from stopping in a position intermediate said limiting positions during said abrupt movement.

12. In a tuner, a chassis having first and second end walls each having an opening therein, means providing a bearing surface adjacent each of said openings, a shaft extending through the openings in said end walls, a fine tuning impedance mounted on said chassis and including a movable tuning element, means including a cam mounted concentrically upon said shaft for moving said element, a support for said cam, means mounting said support for limited movement with respect to said chassis, and a resilient spring mounted on said chassis and acting on said support for biasing said shaft into engagement with the bearing surfaces on the end walls and for resiliently biasing said support against said cam.

13. The apparatus defined by claim 12 wherein said spring includes a bight portion extending between said end walls and an end portion extending along said first end wall and engaging said support.

14. The apparatus defined by claim 13 wherein said shaft carries an index wheel adjacent said second end wall and wherein said spring includes an end portion engaging the said index wheel.

15. The apparatus defined by claim 12 wherein said shaft carries an index wheel engaging said spring to index said shaft in different angular positions.

16. In a tuner, a chassis having first and second end walls each having an opening therein, means providing a bearing surface adjacent each of said openings, a shaft extending through the openings in said end walls, a fine tuning impedance mounted on said first wall and including a movable tuning element, means including a cam mounted concentrically upon said shaft for moving said element, said cam including a hub portion, a support plate having an elongated opening therein for receiving said hub, means mounting said plate for limited movement with respect to said chassis, and a resilient spring mounted on said chassis and acting on said support plate for biasing said shaft into engagement with the bearing surfaces on the end walls and for resiliently biasing said support plate against said hub portion of said cam.

17. The apparatus defined by claim 16 wherein said spring includes a bight portion extending between said end walls and an end portion extending along said first end wall and engaging said support.

18. The apparatus defined by claim 17 wherein said shaft carries an index wheel adjacent said second end wall and wherein said spring includes an end portion engaging the said index wheel.

19. The apparatus defined by claim 16 wherein said shaft carries an index wheel engaging said spring to index said shaft in different angular positions.

20. In a tuner, a chassis having first and second end walls, a shaft mounted for rotation upon said end walls, a fine tuning impedance mounted on said chassis and including a movable tuning element, means including a cam mouted concentrically with respect to said shaft for moving said element, means mounting said cam for limited sliding movement along said first end wall, a support for said cam, an index wheel mounted on said shaft, and a resilient spring mounted on said chassis and acting on said wheel and said support for indexing said shaft in a plurality of different angularly displaced positions and for resiliently biasing said support into engagement with the cam.

21. The apparatus defined by claim 20 wherein said index wheel is mounted on said shaft at a position adjacent said second end wall and wherein said spring includes an end portion engaging the said index wheel, said spring further including a bight portion extending between said support and another end portion extending along said first end wall to engage said support.

22. A tuner comprising a U-shaped chassis having first and second end walls joined by a deck, means defining an opening in each end wall and providing an adjacent bearing surface, a main channel selecting shaft extending through said openings and parallel to said deck, an index wheel having a toothed periphery mounted on said shaft adjacent said first wall, a cam mounted concentrically with said main shaft and having a first hub portion adjacent said second wall, said cam having an end face facing said second wall and including a first portion tapering gradually away from said second wall in a direction extending axially of said main shaft from a first end point located near the second wall to a second point spaced more remotely from said second wall, said end face further including a sharply inclined portion tapering abruptly from said first point to said second point, said cam having a circular peripheral region extending from said end face away from said second wall and axially of said main shaft, a detent formed on said cam and extending radially outward from said peripheral region, said cam further including a second hub portion having a diameter less than that of said peripheral region and extending away from said region axially of said main shaft, a fine tuning shaft mounted concentrically upon said main shaft and including means thereon engageable with said second hub portion for drivingly connecting said fine tuning shaft and said cam, a fine tuning impedance mounted on said second wall and having a movable tuning element mounted for sliding along an axis extending parallel to the axis of said main shaft, said impedance including means biasing said movable element against said end face of said cam so that said element is moved axially by said cam between first and second limiting end positions when the fine tuning shaft is rotated, a retaining plate having an elongated opening therein receiving the second hub portion of the cam, a stud carried by said plate and extending from said plate towards said second wall, means defining a slot in said second wall extending radially from the axis of said main shaft, a bent flange on said plate having a pair of notches therein cooperating to form a track for accommodating the portions of said second wall adjacent said slot, thereby to mount said plate for sliding movement upon said second wall, a torsion bar spring including a bight portion mounted upon said first and second walls and a first resilient arm portion extending along said first wall to engage the toothed periphery of said index wheel, said bar spring further including a second resilient arm portion extending along said second wall and engaging said flange to bias the stud on said retaining plate into engagement with the peripheral region of said cam and also to bias said main shaft against said bearing surfaces, said detent being so located with respect to said stud that it cooperates with said stud to resist turning of the fine tuning shaft beyond each limiting end point where the movable tuning element is in one of said limiting end positions, said detent being effective if said fine tuning shaft is turned beyond each of the limiting end points to move said detent past said stud until the stud reaches a center position on the detent and, hence, to slide said retaining plate with respect to said second wall against the biasing effect of said torsion bar spring, said detent being shaped to prevent said stud from coming to rest on the detent, the torsion bar spring being effective to force the stud along the detent from the center position and into engagement with the peripheral region of the cam, and said detent and said variable impedance being so located that the movable tuning element moves along said sharply inclined portion of said cam end face as said detent passes said stud, thereby to move the tuning element rapidly from one limiting end position to the other and to bring the movable tuning element into engagement with the gradually tapering portion of the cam end face.

23. A tuner comprising a U-shaped chassis having first and second end walls joined by a deck, means defining an opening in each end wall and providing an adjacent bearing surface, a main channel selecting shaft extending through said openings and parallel to said deck, an index wheel having a toothed periphery mounted on said shaft adjacent said first wall, a cam mounted concentrically with said main shaft, said cam having an end face facing said second wall and including a first portion tapering gradually away from said second wall in a direction extending axially of said main shaft from a first end point located near the second wall to a second point spaced more remotely from said second wall, said end face further including a sharply inclined portion tapering abruptly from said first point to said second point, said cam having a circular peripheral region extending from said end face away from said second wall and axially of said main shaft, a detent extending radially outward from said peripheral region, a fine tuning shaft mounted concentrically upon said main shaft and including means thereon drivingly engaging said cam portion for drivingly connecting said fine tuning shaft and said cam, a fine tuning impedance mounted on said second wall and having a movable tuning element mounted for sliding along an axis extending parallel to the axis of said main shaft, said impedance including means biasing said movable element against said end face of said cam so that said element is moved axially by said cam between first and second limiting end positions when the fine tuning shaft is rotated, a retaining plate having an elongated opening therein receiving the cam, a stud carried by said plate and extending from said plate towards said second wall, means mounting said plate for sliding movement upon said second wall, a torsion bar spring including a bight portion mounted upon said first and second walls and a first resilient arm portion extending along said first wall to engage the toothed periphery of said index wheel, said bar spring further including a second resilient arm portion extending along said second wall and engaging said plate to bias the stud into engagement with the peripheral region of said cam and also to bias said main shaft against said bearing surfaces, said detent being so located with respect to said stud that it cooperates with said stud to resist turning of the fine tuning shaft beyond each limiting end point where the movable tuning element is in one of said limiting end positions, said detent being effective if said fine tuning shaft is turned beyond each of the limiting end points to slide said retaining plate with respect to said second wall against the biasing effect of said torsion bar spring, thereby to permit the detent to pass the stud, said detent being shaped to prevent said stud from coming to rest on the detent, and said detent and said variable impedance being so located that the movable tuning element moves along said sharply inclined portion of said cam end face as said detent passes said stud, thereby to move the tuning element from one limiting end position to the other and to bring the movable tuning element into engagement with the gradually tapering portion of the cam end face.

24. A tuner comprising a U-shaped chassis having first and second end walls joined by a deck, means defining an opening in each end wall and providing an adjacent bearing surface, a main channel selecting shaft extending through said openings, an index wheel having a toothed periphery mounted on said shaft adjacent said first wall, a cam having a cam face and mounted concentrically with said main shaft, a fine tuning impedance mounted on said second wall and including a movable tuning element engaging said cam, said cam face including a first portion for moving said element gradually from a first end limiting position to a second end limiting position, a fine tuning shaft mounted concentrically upon said main shaft and including means thereon drivingly engaging said cam, a retaining plate supporting said cam and having a cam follower thereon, means mounting said plate for sliding movement upon said second wall, a torsion bar spring including a bight portion mounted upon said first and second walls and a first resilient arm portion extending along said first wall to engage the toothed periphery of said index wheel, said bar spring further including a second resilient arm portion extending along said second wall and engaging said plate to bias the follower into engagement with the cam, and also to bias the main shaft against said bearing surfaces, a detent formed on said cam and so located with respect to said follower that it cooperates with said follower to resist turning of the fine tuning shaft beyond each limiting end point where the movable tuning element is in one of said limiting end positions, said detent being effective if said fine tuning shaft is turned beyond each of the limiting end points to slide said retaining plate with respect to said second wall against the biasing effect of said torsion bar spring, thereby to permit the detent to pass the follower, said detent being shaped to prevent said follower from coming to rest on the detent, said cam having a second cam portion for moving said element rapidly between said first and second limiting end positions, and said detent and said variable impedance being so located that the movable tuning element moves along said second cam portion as said detent passes said follower, thereby to move the tuning element from one limiting end position to the other and to bring the movable tuning element into engagement with the first cam portion of the cam.

25. A tuner comprising a U-shaped chassis having first and second end walls joined by a deck, means defining an opening in each end wall and providing a adjacent bearing surface, a main channel selecting shaft extending through said openings, an index wheel having a toothed periphery mounted on said shaft adjacent said first wall, a cam having a cam face and mounted concentrically with said main shaft, a fine tuning impedance mounted on said second wall and including a movable tuning element coacting with said cam, said cam face including a first portion for moving said element gradually from a first limiting end position to a second limiting end position, means for rotating said cam, a retaining plate supporting said cam, means mounting said plate for sliding movement upon said second wall, a torsion bar spring including a bight portion mounted upon said first and second walls and a first resilient arm portion extending along said first wall to engage the toothed periphery of said index wheel, said bar spring further including a second resilient arm portion extending along said second wall and engaging said plate to bias the plate into engagement with the cam and also to bias the shaft against said bearing surfaces, said cam having a second surface thereon coacting with said tuning element to move said element rapidly from one of said limiting end positions to the other, and detent means acting on said cam to prevent said tuning element from coming to rest at a position intermediate said limiting end positions during the period when said second cam portion is effective to move said element.

No references cited.